(12) United States Patent  (10) Patent No.: US 6,504,225 B1
McCarthy et al.  (45) Date of Patent: Jan. 7, 2003

(54) TEOS SEAMING SCRIBE LINE MONITOR

(75) Inventors: Michael McCarthy, Red Rock; David E. Cooper, Austin; Denise C. Sale, Lockhart, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/837,358

(22) Filed: Apr. 18, 2001

(51) Int. Cl.[7] ............................................... H01L 29/00
(52) U.S. Cl. ...................... 257/508; 257/501; 257/506; 257/446
(58) Field of Search .................... 257/758, 93, 446, 257/501, 506, 508, 523, 725, 776; 438/424, 296; 204/192.23

(56) References Cited

U.S. PATENT DOCUMENTS

| | | | | |
|---|---|---|---|---|
| 5,003,374 A | * | 3/1991 | Vokoun, III | 257/68 |
| 5,262,353 A | * | 11/1993 | Sun et al. | 257/503 |
| 5,585,673 A | * | 12/1996 | Joshi et al. | 257/751 |
| 5,895,255 A | * | 4/1999 | Tsuchiaki | 438/427 |
| 5,915,190 A | * | 6/1999 | Pirkle | 438/424 |
| 6,087,705 A | * | 7/2000 | Gardner et al. | 257/510 |
| 6,096,621 A | * | 8/2000 | Jennings | 438/404 |
| 6,197,661 B1 | * | 3/2001 | Mogami et al. | 438/437 |
| 6,268,717 B1 | * | 7/2001 | Jarvis et al. | 324/158.1 |
| 6,281,081 B1 | * | 8/2001 | Chien et al. | 438/296 |
| 6,319,796 B1 | * | 11/2001 | Laparra et al. | 438/435 |

* cited by examiner

*Primary Examiner*—David Nelms
*Assistant Examiner*—Andy Huynh
(74) *Attorney, Agent, or Firm*—Timothy M. Honeycutt

(57) ABSTRACT

Various embodiments of a circuit device for detecting the presence of unwanted conductor structures in insulation structure seams and methods of making the same are provided. In one aspect, a circuit device is provided that includes an insulating structure positioned on a substrate and a first conductor structure that has a first member positioned on the insulating structure. A second conductor structure is provided that has a second member positioned on the insulating structure. The second member projects toward the first conductor structure and the first member projects toward the second conductor structure, but the first and second conductor structures are not in physical contact. A current flowing between the first and second conductor structures when a bias is applied between the first and second conductor structures is indicative of a third conductor structure present on the insulating structure and contacting the first and second members.

43 Claims, 9 Drawing Sheets

TEOS SEAMING SCRIBE LINE MONITOR

BACKGROUND OF THE INVENTION

1. Field of the Invention

This invention relates generally to semiconductor processing, and more particularly to a circuit device for detecting the presence of conductor structures in insulation structure seams and to methods of making the same.

2. Description of the Related Art

The implementation of integrated circuits involves connecting isolated circuit devices through specific electrical pathways. Where integrated circuits are implemented in silicon, it is necessary, therefore, to initially isolate the various circuit devices built into the silicon substrate from one another. The circuit devices are thereafter interconnected to create specific circuit configurations through the use of global interconnect or metallization layers and local interconnect layers.

Local oxidation of silicon ("LOCOS") and trench and refill isolation represent two heavily used isolation techniques for both bipolar and metal oxide semiconductor ("MOS") circuits. In a conventional semi-recessed LOCOS process, a thin pad oxide layer is thermally grown on a silicon substrate surface and coated with a layer of chemical vapor deposition ("CVD") silicon nitride. The active regions of the substrate are then defined with a photolithographic step. The nitride layer is then dry etched and the pad oxide layer is wet or dry etched with the photoresist left in place to serve as a masking layer for a subsequent channel stop implant. After the channel stop implant, field oxide regions are thermally grown by means of a wet oxidation step. The oxidation of the silicon proceeds both vertically into the substrate and laterally under the edges of the nitride layer, resulting in the formation of structures commonly known as bird's beaks.

In trench-based isolation structures, a damascene process is used to pattern and etch a plurality of trenches in the silicon substrate. The trenches are then refilled with a CVD silicon dioxide or doped glass layer that is planarized back to the substrate surface using etchback planarization or chemical mechanical polishing ("CMP").

Although conventional trench and refill isolation techniques eliminate the difficulties associated with bird's beak formation in LOCOS processes, certain difficulties may remain.

One of these is the formation of unwanted seams or voids in the upper reaches of the trench isolation structure. During the plethora of processing steps that follow isolation formation, these seams may become filled with conducting materials, such as doped polysilicon, refractory metal silicides, or metals. Such unwanted conductor structures can lead to shorts between active devices.

The causes of seam formation are legion. In some cases, etch removal of protective films present over active device regions during trench isolation formation may attack the upper surface of the isolation structure and produce a seam. Rip-out during CMP can also produce a seam. Finally, a void may form during CVD of the trench fill material. Such voids may remain open during CVD or sometimes close over with a thin top layer. The thin top layer may be thereafter removed inadvertently during etching or CMP.

Conventional attempts to address seam formation on isolation structures focus on overetching to eliminate any material pooling in the seam, on defect inspection and on electrical testing. Each technique has drawbacks. Overetching cannot always guarantee complete material removal from a seam. Defect inspection may prove difficult since the seams often appear in the most densely populated areas of a chip. In these areas, discrimination of sometimes very small scale seam-located conductor structures can challenge the most sophisticated inspection tools. Finally, conventional electrical testing can detect the presence of an electrical fault. However, conventional electrical testing is done at a relatively late stage in die processing and is not tailored to identify and characterize seam-related electrical anomalies.

The present invention is directed to overcoming or reducing the effects of one or more of the foregoing disadvantages.

SUMMARY OF THE INVENTION

In accordance with one aspect of the present invention, a circuit device is provided that includes an insulating structure positioned on a substrate and a first conductor structure that has a first member positioned on the insulating structure. A second conductor structure is provided that has a second member positioned on the insulating structure. The second member projects toward the first conductor structure and the first member projects toward the second conductor structure, but the first and second conductor structures are not in physical contact. A current flowing between the first and second conductor structures when a bias is applied between the first and second conductor structures is indicative of a third conductor structure present on the insulating structure and contacting the first and second members.

In accordance with another aspect of the present invention, a circuit device is provided that includes an isolation structure positioned on a substrate and a first conductor structure that has a first member positioned on the isolation structure. A second conductor structure is provided that has a second member positioned on the isolation structure. The second member projects toward the first conductor structure and the first member projects toward the second conductor structure, but the first and second conductor structures are not in physical contact. A current flowing between the first and second conductor structures when a bias is applied between the first and second conductor structures is indicative of a third conductor structure present on the isolation structure and contacting the first and second members.

In accordance with another aspect of the present invention, a circuit device is provided that includes an isolation structure positioned on a substrate and a first conductor structure that has a first plurality of members positioned in spaced-apart relation on the isolation structure to define a first plurality of gaps. A second conductor structure is provided that has a second plurality of members positioned in spaced-apart relation on the isolation structure. The second plurality of members project toward the first conductor structure and into one or more of the plurality of gaps, but the first and second conductor structures are not in physical contact. A current flowing between the first and second conductor structures when a bias is applied between the first and second conductor structures is indicative of a third conductor structure present on the isolation structure and contacting at least one of the first plurality of members and at least one of the second plurality of members.

In accordance with another aspect of the present invention, an integrated circuit is provided that includes a substrate, a plurality of transistors on the substrate, and an isolation structure positioned on the substrate. A first conductor structure is provided that has a first member positioned on the isolation structure. A second conductor structure is provided that has a second member positioned on the isolation structure. The second member projects toward the first conductor structure and the first member projects toward the second conductor structure, but the first and second conductor structures are not in physical contact. A current flowing between the first and second conductor structures when a bias is applied between the first and second conductor structures is indicative of a third conductor structure present on the isolation structure and contacting the first and second members.

In accordance with another aspect of the present invention, a method of processing a substrate is provided that includes forming an insulating structure on the substrate and forming first conductor structure that has a first member positioned on the insulating structure. A second conductor structure is formed that has a second member positioned on the insulating structure such that the second member projects toward the first conductor structure and the first member projects toward the second conductor structure without there being physical contact between the first and second conductor structures. A bias is applied between the first and second conductor structures and an electric current flowing between the first and second conductor structures is sensed, the electric current being indicative of a third conductor structure present on the insulating structure and contacting the first and second members.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
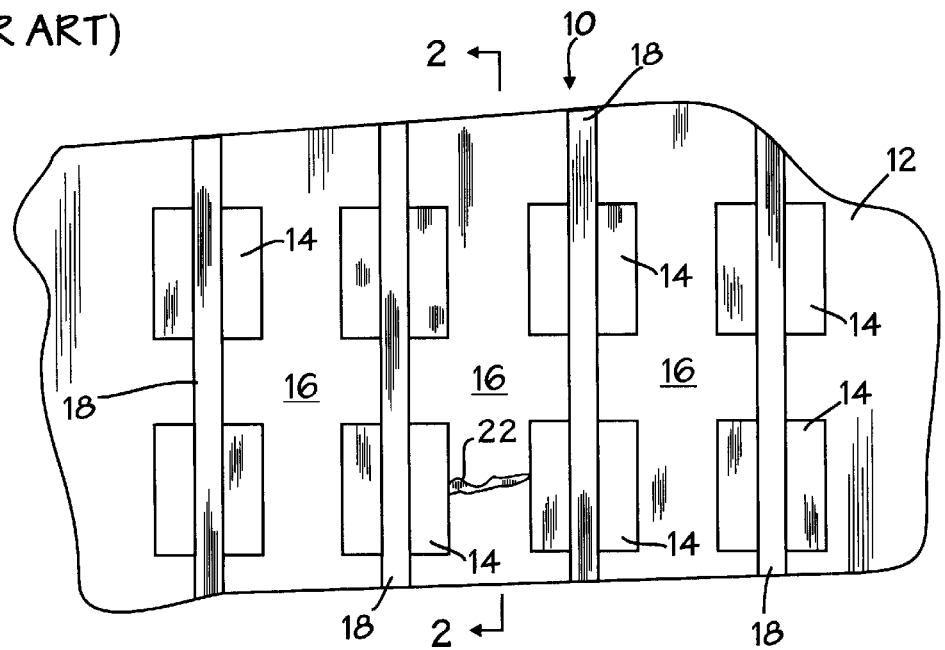
FIG. 1 is a plan view of a small portion of a conventional integrated circuit implemented on a semiconductor substrate.
Figure 2:
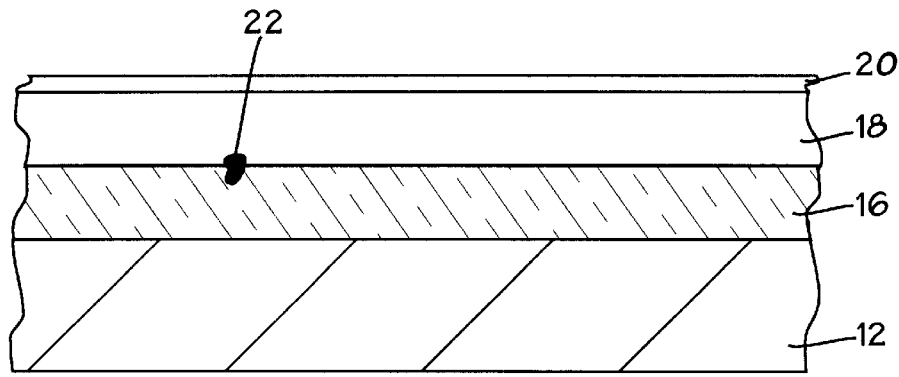
FIG. 2 is a cross-sectional view of FIG. 1 taken at section 2—2 and illustrating a seam-based rogue conductor structure.

In the drawings described below, reference numerals are generally repeated where identical elements appear in more than one figure. FIG. 1 is a plan view of a small portion of a conventional integrated circuit 10 implemented on a semiconductor substrate 12. The integrated circuit 10 includes a plurality of active device regions 14 that are laterally isolated by trench isolation structures 16. A plurality of polysilicon conductor lines 18 criss-cross the various device regions 14. Such conductor lines 18 may function as gate electrodes, local interconnects or similar type devices. Referring now also to FIG. 2, which is a cross-sectional view of FIG. 1 taken at section 2—2, the polysilicon lines 18 are capped with silicide films 20. The active device regions 14 are similarly capped with silicide films that are not visible in FIG. 2 or separately delineated in FIG. 1. Note that the films 18 and 20 are not shown in cross-hatched due to the location at which the cross-section is taken for FIG. 2. As a result of unintended circumstances, a rogue silicided structure 22 has formed on the isolation structure 16. The rogue silicided structure 22 extends between the adjacent device regions 14 and acts as a conducting pathway therebetween. In this way, significant short circuiting and leakage currents may occur when power is applied to the integrated circuit 10.

Figure 3:
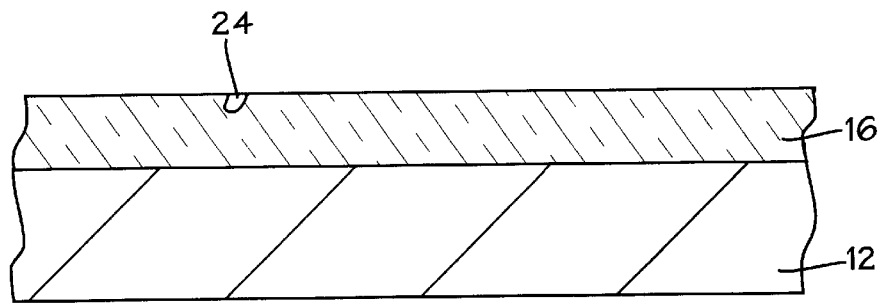
FIG. 3 is a cross-sectional view like FIG. 2 depicting formation of an isolation structure and a void or seam therein.
Figure 4:
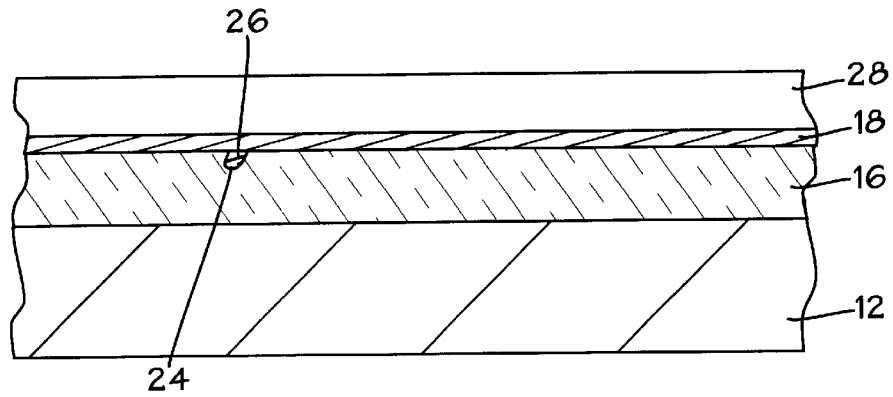
FIG. 4 is a cross-sectional view like FIG. 3 depicting formation of the rogue conductor structure in the void or seam.

A conventional process flow that may lead to the establishment of the rogue silicide structure 22 depicted in FIGS. 1 and 2 may be understood by referring now to FIGS. 3 and 4. FIGS. 3 and 4 are cross-sectional views taken at the same section as FIG. 2. Initially, the isolation structure 16 is fabricated on the semiconductor substrate 12 by any of a variety of well-known trench isolation techniques that usually entail trench etch followed by bulk insulator deposition. As a result of unanticipated process conditions, a void or seam 24 is formed in the upper surface of the isolation structure 16. The void 24 may result from a variety of unanticipated and undesirable process conditions, such as, for example, CMP rip-out, void formation during insulator deposition followed by void exposure during wet or dry etching processes, and void formation during bulk insulator deposition. Referring now to FIG. 4, the fabrication of the polysilicon conductor lines 18 entails the blanket deposition of polysilicon followed by anisotropic etching to define the desired shapes for the individual conductor lines 18. The blanket deposition process fills the void 24 with polysilicon 26 as is illustrated in FIG. 4. If the polysilicon 26 present in the void 24 remains following the etch definition of the conductor line 18, a subsequent blanket deposition of a refractory metal film 28 and silicide-forming anneal will produce a silicide film on the top of the conductor line 18 as shown as element 20 in FIG. 2, and also convert the polysilicon 26 depicted in FIG. 4 into silicide as shown by the silicide structure 22 in FIG. 2. Referring again to FIG. 2, a subsequent metal etch to remove any unreacted portions of the refractory metal layer 28 depicted in FIG. 4 will leave the silicide film 20 on the conductor line 18, but also the rogue silicided structure 22 on the isolation structure 16.

It is accordingly desirable to be able to identify the presence of such unwanted conductor structures, such as the rogue structure 22 as early in a given process flow as possible. An exemplary embodiment of a circuit device in accordance with the present invention for achieving this early detection of such unwanted conductor structures may be understood by referring now to FIGS. 5, 6, 7 and 8. FIG.

5 is a plan view of an exemplary integrated circuit 30 implemented on a substrate 32. The substrate 32 may be composed of silicon, silicon-on-insulator or other suitable substrate materials. The integrated circuit 30 includes a plurality of different types of circuit devices 34 such as, for example, transistors, capacitors, resistors, or any of a myriad of different types of devices used to make up integrated circuits. In addition, one or more scribe lines 36 are provided on the substrate 32. A small portion of the scribe line 36 is identified by the arrow 38.

Figure 6:
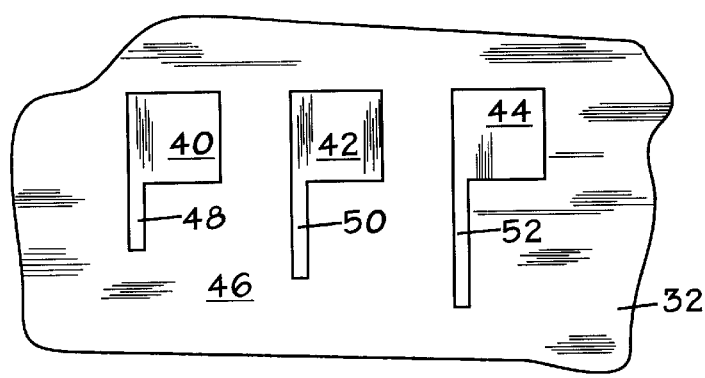
FIG. 6 is a magnified plan view of a portion of a circuit device in accordance with the present invention.
Figure 7:
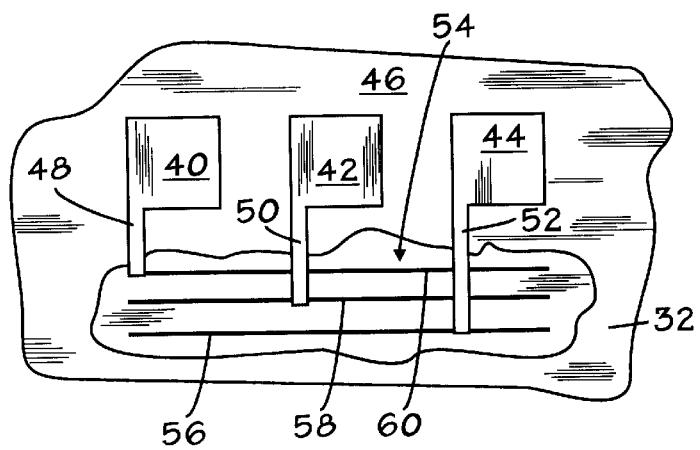
FIG. 7 is a plan view like FIG. 6, but shown partially cut away to reveal more detail of the circuit device in accordance with the present invention.

Two magnified plan views of a portion of the substrate 32 at the scribe line location 38 are illustrated in FIGS. 6 and 7. FIG. 6 is a magnified plan view of a portion of the substrate 32 at the scribe line location 38. A plurality of conductor pads 40, 42 and 44 are provided on an interlevel dielectric layer 46. The conductor pads 40, 42 and 44 are provided with respective extension members 48, 50 and 52. FIG. 7 is a plan view like FIG. 6, but with a portion of the interlevel dielectric layer 46 shown cut away to reveal an underlying circuit device 54 that includes a plurality of conductor structures, three of which are shown and designated 56 58 and 60 respectively. The conductor structures 56, 58 and 60 are at least partially formed on an underlying isolation structure layer 62. The conductor pad extension member 48 is in ohmic contact with the conductor structure 60, the pad extension member 50 is in ohmic contact with the conductor member 58 and the pad extension member 52 is in ohmic contact with the conductor member 56.

Figure 8:
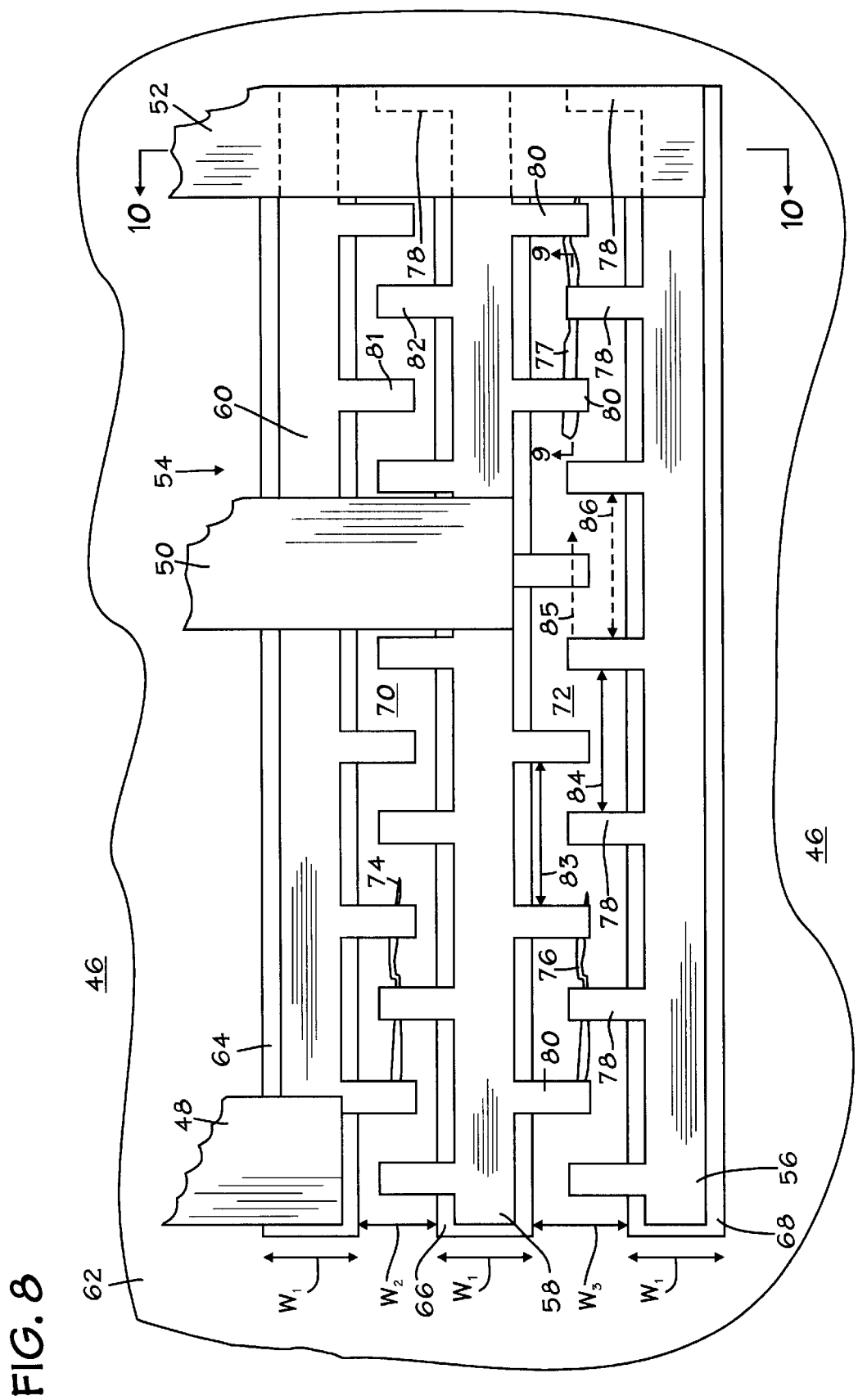
FIG. 8 is a magnified plan view of FIG. 7 in accordance with the present invention.

The detailed structure of the circuit device 54 and the conductor members 56, 58 and 60 thereof may be understood by referring now to FIG. 8, which is a magnified plan view of the cut away portion shown in FIG. 7. Portions 64, 66 and 68 of the substrate 32 (see FIG. 7) are circumscribed by the isolation structure layer 62. The portions 64 and 66 of the substrate are separated laterally by a portion 70 of the isolation structure 62 while the portions 66 and 68 are separated by a portion 72 of the isolation structure 62. The substrate portions 64, 66 and 68 may but need not be provided with substantially the same width, $W_1$. The portions 70 and 72 of the isolation structure 62 may be provided with the same or different widths, $W_2$ and $W_3$ as shown. The purpose of the staggered widths, $W_2$ and $W_3$, will be described in more detail below.

Figure 5:
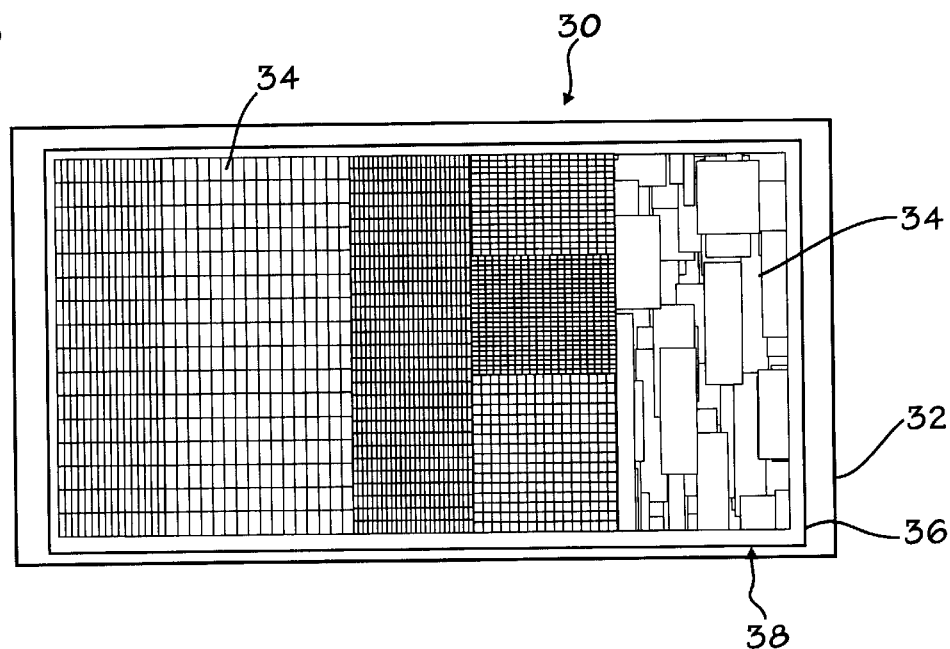
FIG. 5 is a plan view of an exemplary embodiment of an integrated circuit incorporating a circuit device for detecting the presence of seam-based rogue conductor structures in accordance with the present invention.

The isolation structure layer 62 is advantageously fabricated using the same types of materials and techniques used to establish isolation structures for active device fabrication on the integrated circuit 30 depicted in FIG. 5. For example, if LOCOS is used to fabricate isolation structures on the integrated circuit 30, then LOCOS may be used to fabricate the isolation structure 62 as well. Similarly, if trench isolation is used then trench isolation may also be used to establish the isolation structure 62. In the embodiment disclosed in FIG. 8, the isolation structure 62 is fabricated using well-known trench isolation and refill techniques. The fill material for the isolation structure 62 may be tetra-ethyl-ortho-silicate ("TEOS").

The purpose of the circuit device 54 is to provide a means of detecting the presence of unwanted conductor structures forming in the isolation structure 62. The conductor structures 56, 58 and 60 are designed to establish ohmic contact with any unintended conductor structures formed on the portions 70 and/or 72 of the isolation structure 62. Three such unwanted conductor structures 74, 76 and 77 are illustrated. In order to ensure that ohmic contact is established regardless of the exact positions of the rogue conductor structures 74, 76 and 77 on the portions 70 and 72, the conductor structures 56, 58 and 60 are provided with a plurality of interwoven or overlapping members. For example, the conductor structure 56 may be provided with a plurality of members 78 that project across the portion 72 of the isolation structure 62 toward the conductor member 58. Similarly, the conductor structure 58 may be provided with a plurality of members 80 that project across the portion 72 toward the conductor structure 56. The conductor structure 60 may be provided with a like plurality of members 81 that cooperate with a second plurality of members 82 projecting from the conductor structure 58.

The following description of the members 78 and 80 is also illustrative of the members 81 and 82. The members 78 and 80 are formed in spaced-apart relation to define respective pluralities of gaps 83 and 84 therebetween. The respective members 78 and 80 are overlapping in space, that is, the members 78 project across the portion 72 into the gaps 83 and the opposing members 80 project into the gaps 84. The purpose of the overlap in space between the opposing members 78 and 80 is to ensure that ohmic contact is established between two adjacent members, such as 56 and 58, and a rogue conductor structure, such as the structure 77, regardless of where on the portion 72 the rogue conductor structure is positioned. Stated otherwise, a hypothetical line 84 passing along the upper surface or plane of the portion in a direction parallel to a longitudinal axis 86 of the portion 72 will pass through at least one. of the members 78 and at least one of the members 80.

Figure 9:
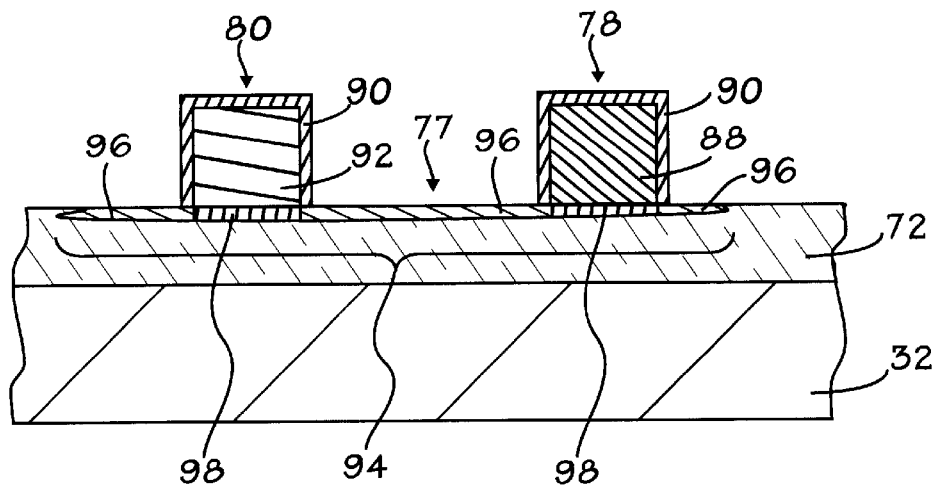
FIG. 9 is a cross-sectional view of FIG. 8 taken at section 9—9 in accordance with the present invention.

The detailed structure of one of the members 78 and one of the members 80 in ohmic contact with the rogue conductor structure 77 may be understood by referring now to FIG. 9, which is a cross-sectional view of FIG. 8 taken at section 9—9. The member 78 consists of a polysilicon or amorphous silicon structure 88 coated with a refractory metal silicide film 90. The member 80 similarly consists of a polysilicon or amorphous silicon structure 92 coated with a refractory metal silicide film 90. This arrangement ensures that the fabrication of the members 78 and 80 mimics the processing used to fabricate silicided polysilicon structures. In this way, the process conditions that normally lead to formation of rogue conductor structures on isolation structures in active circuit regions are duplicated in the vicinity of the circuit device 54. Optionally, the members 78 and 80 may be fabricated from other conductor materials that may fill seams, such as various metals or metal compounds.

The rogue conductor structure 77 forms in a seam or void 94 in the isolation structure portion 72. The void 94 may be the result of any of the aforementioned mechanisms described above that may lead to the formation of a surface void in an isolation structure. As described more fully below, portions 96 of the rogue conductor structure 78 are converted to silicide while portions 98 positioned beneath the polysilicon structures 88 and 92 consist of polysilicon deposited in the void at the time of blanket deposition to establish a polysilicon film from which the structures 88 and 92 are defined by etching.

While three conductor structures 56, 58 and 60 having respective pluralities of members 78, 80, 81 and 82 are depicted, it is anticipated that the benefits of the present invention may be realized with two conductor structures, such as 56 and 58, each having a single member positioned in an overlapped orientation, such as any two of the members 78 and 80. Obviously a higher number of members and a greater overlap between each will provide better coverage of a given piece of isolation structure, such as the portion 72. However, the skilled artisan will appreciate that the number and spacing: of the conductor structures and their respective members are largely matters of design discretion.

Figure 10:
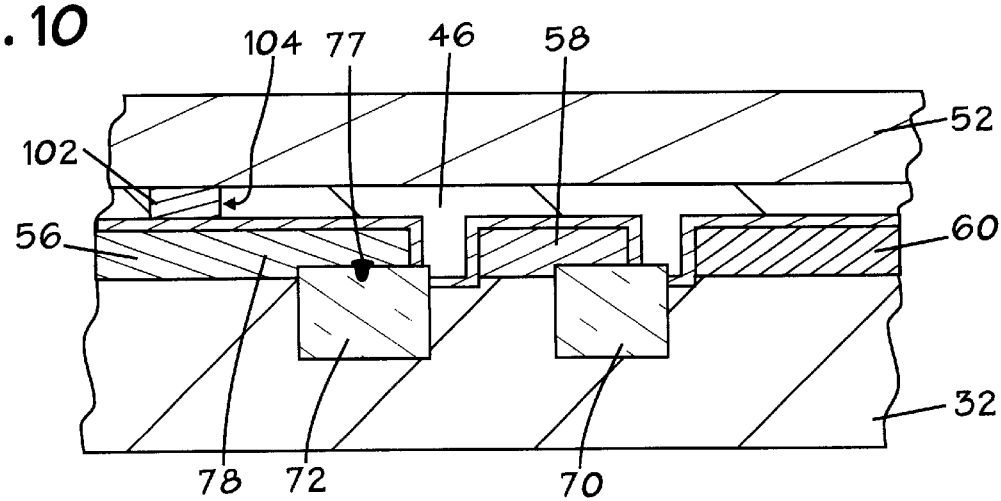
FIG. 10 is a cross-sectional view of FIG. 9 taken at section 10—10 in accordance with the present invention.

FIG. 10 is a cross-sectional view of FIG. 8 taken at section 10—10 and provides another perspective of the interconnection between the conductor extension 52 and the conductor member 56. The depiction of the interconnection is exemplary of the interconnections between the conductor extension member 50 and the conductor extension member 58, and between the conductor extension 48 and the conductor extension member 60 as well. Ohmic contact between the conductor extension 52 and the underlying member 78 of the conductor structure 56 (obscured by the member 52 in FIG. 8) is provided by a contact structure 102 that may be a unitary structure as shown or a stacked contact as desired. The contact structure 102 is formed in an opening 104 in the interlevel dielectric layer 46. Note that ohmic contact is established between the member 78 and the rogue conductor structure 77 as well as the member 80 shown in FIG. 8.

Figure 11:
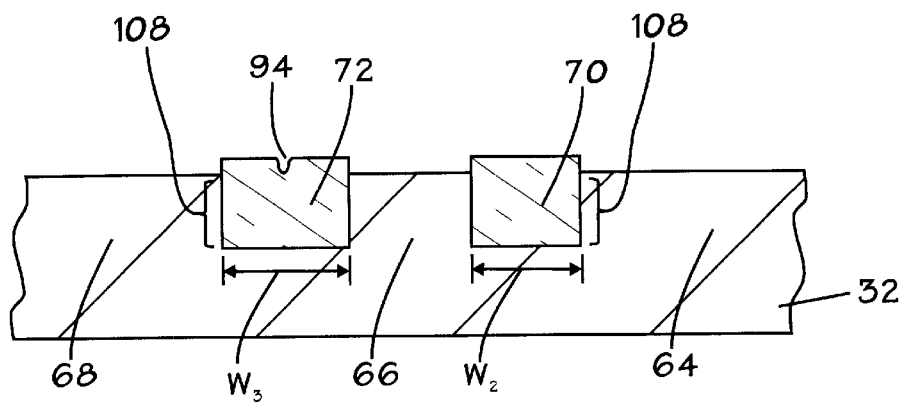
FIGS. 11–18 depict cross-sectional views of a substrate undergoing processing to fabricate an exemplary embodiment of the circuit device of FIGS. 7–10 in accordance with the present invention.

An exemplary method for fabricating the circuit device 54 depicted in FIG. 8 may be understood by referring now to FIGS. 11–20. As illustrated in FIG. 11, which is a sectional view like FIG. 10, the trench isolation structures or portions 70 and 72 are initially fabricated in the substrate 32 using well-known trench etch and refill techniques. For example, portions of the substrate 32 selected for the portions 64, 66 and 68 are initially masked (not shown) and trenches 108 are cut into the substrate 32 by directional etching using, for example, reactive ion etching ("RIE"), chemical plasma etching or the like in conjunction with a variety of etchant species suitable for anisotropically etching silicon, such as, for example, $CF_4/O_2$. The masking of the portions 64, 66 and 68 may include an oxideinitride stack (not shown). The trenches 108 may be formed with a depth of about 2000 to 5000 Å.

A subsequent bulk insulation refill step may be performed to establish the structures 70 and 72. For example, CVD TEOS or silane may be used. Optionally, doped glasses may be used. In an exemplary embodiment, TEOS may be deposited by CVD and planarized using CMP, etch back planarization or the like. It is assumed, for the purpose of illustrating the present invention, that the fabrication process to establish the isolation portions 70 and 72 produced the void 94 illustrated in the cross-sectional view of FIG. 9. As noted above, the void 94 acts as a repository for polysilicon, which in-turn, leads to the formation of the rogue conductor structure 77 shown in FIGS. 8 and 9. Note that the isolation portions 70 and 72 may be fabricated with different widths $W_2$ and $W_3$. This may be desirable in order to assess the impact of the width of a given isolation portion on the propensity and mechanics of void formation.

Figure 12:
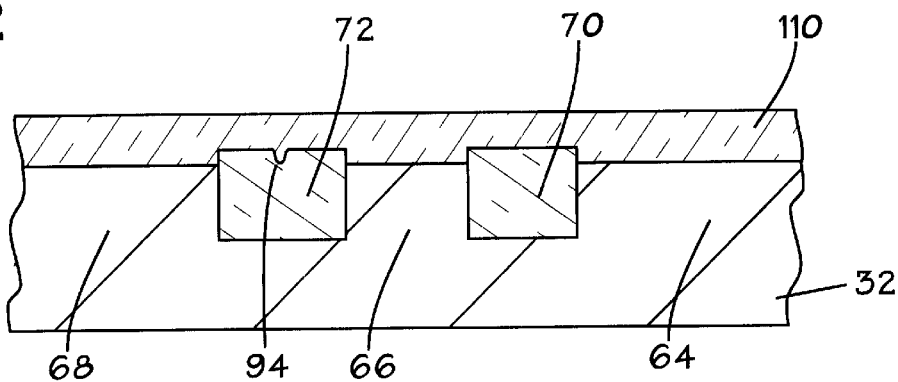

Referring now to FIG. 12, a film 110 of polycrystalline or amorphous silicon is deposited over the substrate 32 filling the void 94. As noted above, the fabrication of the circuit device 54 is tailored to mimic the process conditions subjected to isolation structures elsewhere on the integrated circuit 30. Accordingly, in circumstances where polysilicon is deposited as a gate electrode or other type of conductor structure over isolation structures, polysilicon may be the appropriate material selected for the film 110. In an exemplary embodiment, the film 110 may be composed of polysilicon and deposited to a thickness of about 800 to 1500 Å.

Figure 13:
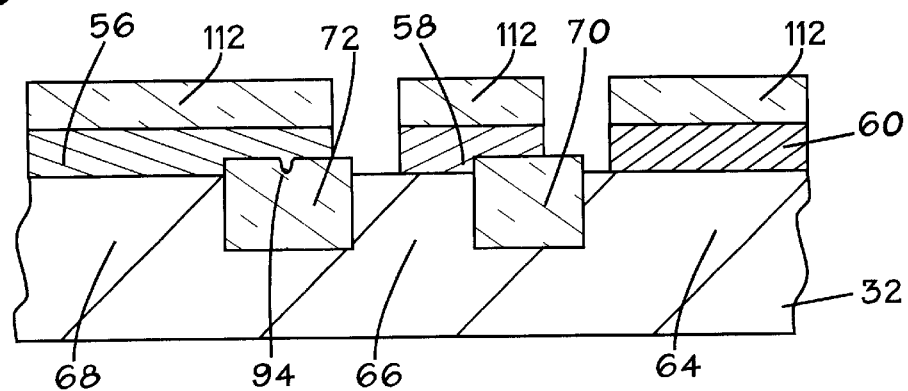

Referring now to FIG. 13, the polysilicon film 110 depicted in FIG. 12 is appropriately masked with a photoresist mask 112 and anisotropically etched to define the conductor structures 56, 58 and 60. The photomask 112 is subsequently stripped by ashing, solvent stripping techniques, combinations of the two or the like.

Figure 14:
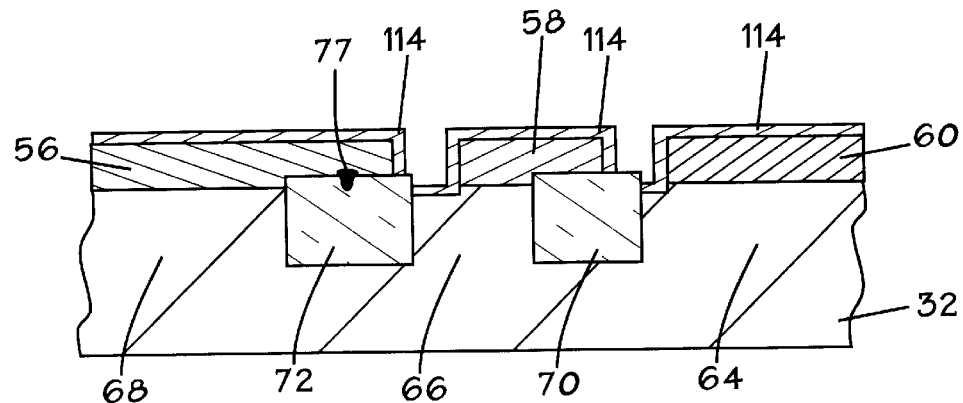

Referring now to FIG. 14, a refractory metal film 114 is deposited; on the exposed portions of the substrate regions 64, 66 and 68 as well as over the conductor structures 56, 58 and 60. A blanket deposition of a refractory metal, such as, for example, cobalt, titanium, nickel or the like, is followed by a single or dual stage anneal process to convert the deposited metal into silicide. In an exemplary embodiment, cobalt is deposited by physical vapor deposition to a thickness of about 50 to 300 Å.

Figure 15:
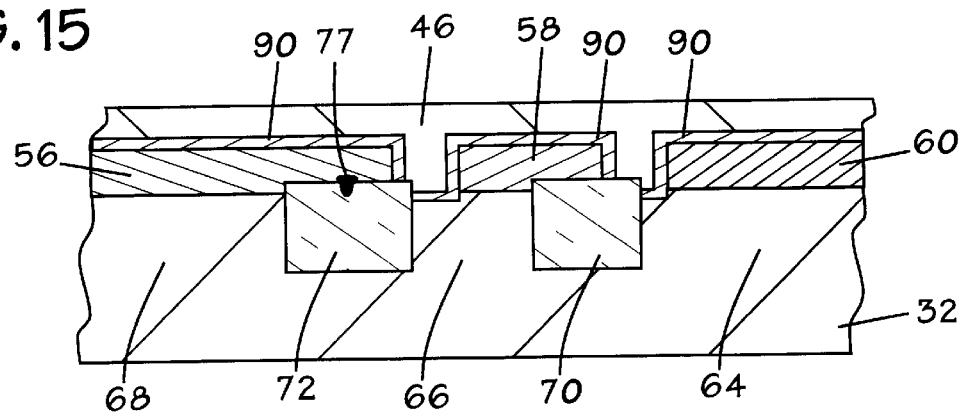

Referring now to FIG. 15, the substrate 32 is heated to initiate a silicide-forming reaction and convert the metal layer 114 shown in FIG. 14 into the silicide film 90. The heating step may be performed at about 400 to 600° C. for about 30 to 120 seconds in a rapid thermal anneal with an inert ambient of argon or nitrogen. Any unreacted metal remaining after the first anneal is removed by wet etching. For example, a H2O:NH4OH:H2O2 or an H2SO4:H2O2 dip may be used. A second anneal is next performed to transform the silicide layer 90 into a final low ohmic phase. A rapid thermal anneal may be performed at about 480 to 640° C. for about 30 to 60 seconds.

Note that the silicidation reaction produces the rogue conductor structure 77 in the seam 94. Although the sectional view depicted in FIG. 14 does not reflect that the silicide film 90 is in ohmic contact with the rogue conductor structure, the perspective of the region depicted in FIG. 9 illustrates that there is indeed ohmic contact between the silicide film 90 and the rogue conductor structure 77. It is anticipated that the rogue conductor structure 77 will not undergo complete silicidation as reflected by the unsilicided portions 98 shown in FIG. 9.

Still referring to FIG. 15, the interlevel dielectric layer 46 (shown from an overhead perspective in FIG. 8), is deposited over the substrate 32 and the respective conductor structures 56, 58 and 60. Well-known materials and techniques may be used for the interlevel dielectric layer 46. For example, TEOS, doped glass or the like may be used with CVD to establish the film 46 to a thickness of about 2000 to 6000 Å.

Figure 16:
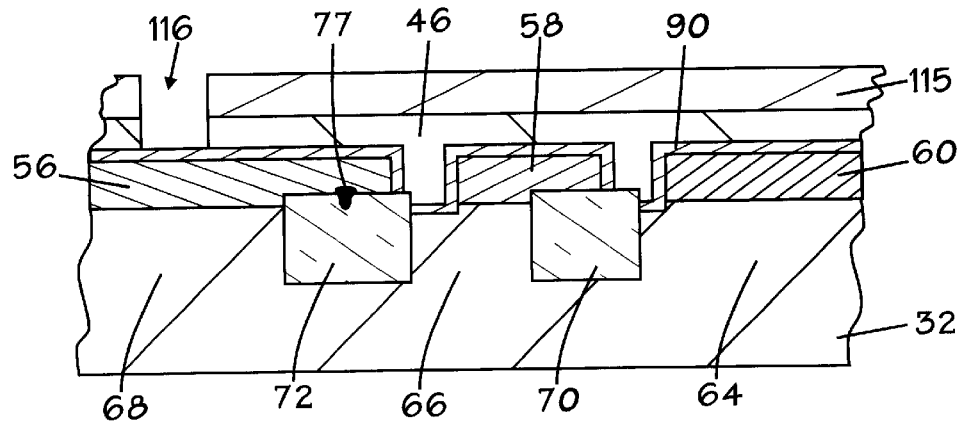

Referring now to FIG. 16, a suitable photomask 115 is patterned on the interlevel dielectric layer 46 and an anisotropic etch is performed to establish a contact via 116 in the interlevel dielectric layer 46. Well-known directional etching using, for example, reactive ion etching ("RIE"), chemical plasma etching or the like may be performed in conjunction with a variety of etchant species suitable for anisotropically etching oxide, such as, for example, $C_2F_6$ and $C_4F_8$. Following the etch, the mask 115 may be stripped by ashing, solvent stripping techniques, combinations of the two or the like.

Figure 17:
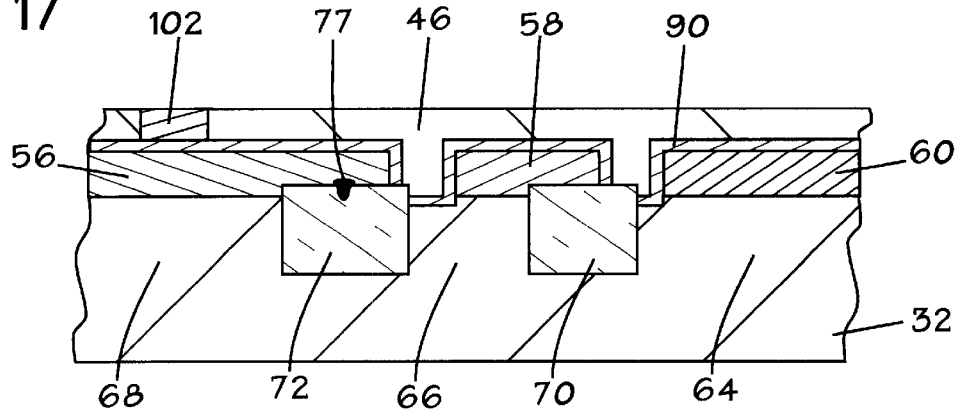

Referring now to FIG. 17, the contact structure 102 may be established in the opening 116. The contact structure 102 may be fabricated from a variety of well-known contact structure materials, such as, for example, tungsten, aluminum, refractory metals, copper, copper-aluminum alloys, or the like. If the material selected requires enhanced adhesion to the sidewalls of the opening 116 or a diffusion barrier, a suitable adhesion and/or diffusion barrier film (not shown) may be laid down prior to the deposition of the structure 102 as necessary. For example, a titanium-titanium nitride laminate may be laid down where tungsten is selected as the material for the structure 102. Following deposition, a planarization process by CMP or the like is performed to planarize the structure 102 substantially to the interlevel dielectric layer 46 as shown in FIG. 17.

Figure 18:
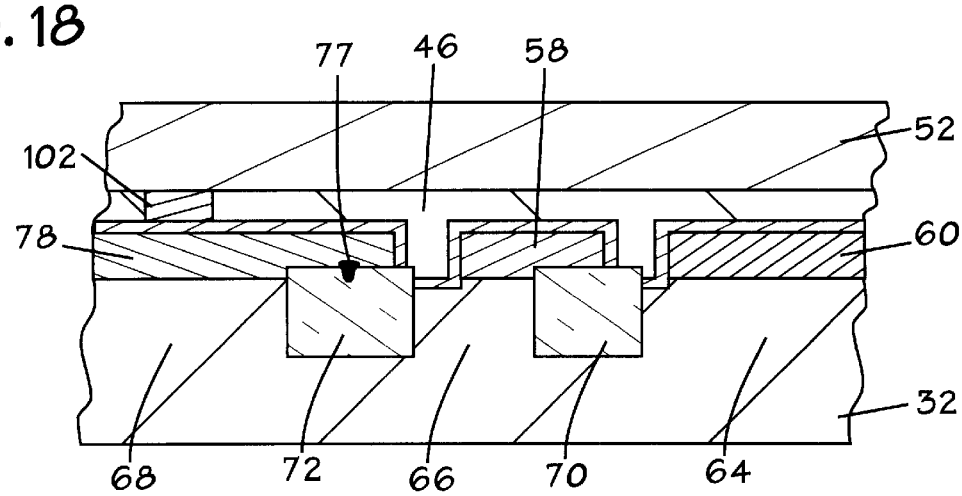

Referring now to FIG. 18, the conductor pad and extension member 52 are established on the interlevel dielectric layer 46 in ohmic contact with the contact structure 102 by deposition of a suitable conducting material and subsequent etch definition. Again, a variety of conductor materials may be suitable for the structure 52, such as, for example, gold, copper, aluminum or the like. In an exemplary embodiment, aluminum is deposited by physical vapor deposition to a thickness of about 2000 to 6000 Å and directionally etched using well-known etching techniques for etching aluminum, such as, for example, reactive ion etching in HBr and chlorine.

Figure 19:
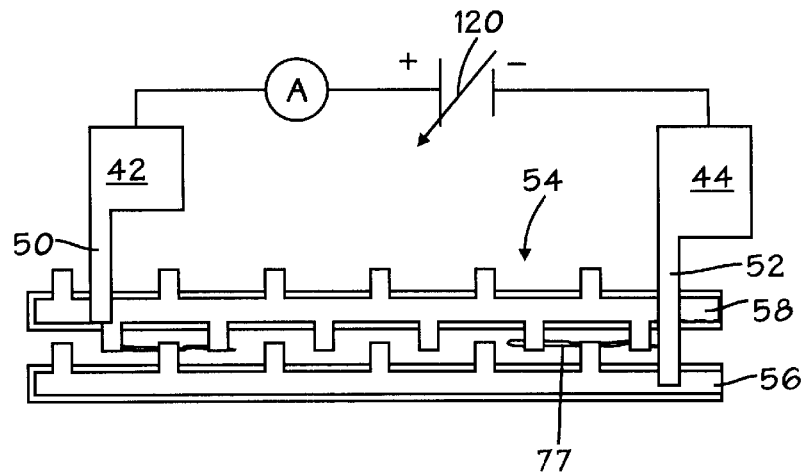
FIG. 19 is a schematic plan view of an exemplary embodiment of the circuit device coupled to a voltage source and current sensor in accordance with the present invention.
Figure 20:
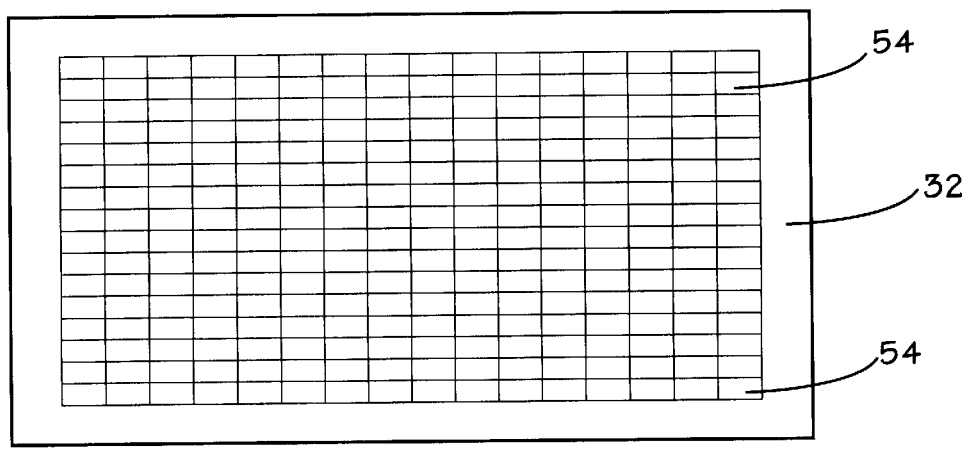
FIG. 20 is a plan view of an alternate embodiment of a circuit device in accordance with the present invention.

The operation of the circuit structure 54 may be understood by referring now to FIG. 19, which is an overhead schematic view of the device 54 coupled to a voltage source 120 and a current sensor or meter 122. The portion of the circuit device 54 encompassing the conductor pads 42 and 44 (see FIG. 7) as well as the conductor structures 56 and 58 is shown. A bias is applied between the conductor pads 42 and 44 by the voltage source 120. If there were no rogue conductor structures present on the isolation portion 72, such as the rogue conductor structure 77 shown in FIG. 19, an open circuit condition would exist between the conductor structures 56 and 58, and the current meter 122 would read essentially zero. However, because of the presence of the rogue conductor structure 77, the circuit structures 56 and 58 establish ohmic contact with the rogue conductor structure 77, producing a closed circuit between the pads 42 and 44. The result is a current that is detectable by the current meter 122. Thus, when the current sensed by the current meter 122 is greater than zero, the presence of one or more rogue conductor structures, such as the structure 77, is indicated.

The current sensor 122 and the voltage source 120 may be external to the circuit device 54 or may be implemented on-chip as desired. For example, a probe tester may be used to externally stimulate the circuit device 54.

Regardless of the particular location of the voltage source 120 and the current sensor 122, a current reading indicating the presence of the rogue conductor structure 77 will suggest the need for further investigation. For example, the integrated circuit 30 (See FIG. 5) may undergo defect inspection by laser scanning, optical or electron microscopy, as well as Raman spectroscopy to determine the composition and possible root causes of the rogue conductor structure 77. Note that the known location of the circuit structure 54 may be specifically targeted during these diagnostics.

In the embodiment described above, the circuit device 54 is implemented at a scribe line 36 location. This is largely a matter of convenience as scribe line areas provide die area for optional circuitry. However, the skilled artisan will appreciate that the circuit device 54 may be implemented at virtually any location on a given substrate, die or wafer. This is illustrated in an alternate embodiment depicted in FIG. 20. There, the circuit device 54 is replicated en masse on a substrate 32. This embodiment may be useful in determining if seam or void formation in isolation structures exhibits a pattern across a substrate or wafer surface. Such trends might indicate, for example, a contaminant vector or mass transport variation in a processing chamber.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A circuit device, comprising:
an insulating structure positioned on a substrate and having a first portion with a first width and a second portion with a second width greater than the first width;
a structure laterally separating the first and second portions of the insulating structure;
a first conductor structure having a first member positioned on one of the first or second portions of the insulating structure;
a second conductor structure having a second member positioned on the one of the first or second portions of the insulating structure, the second member projecting toward the first conductor structure and the first member projecting toward the second conductor structure, the first and second conductor structures not being in physical contact; and
whereby a current flowing between the first and second conductor structures when a bias is applied between the first and second conductor structures being indicative of a third conductor structure present on the insulating structure and contacting the first and second members.

2. The circuit device of claim 1, wherein the insulating structure comprises TEOS.

3. The circuit device of claim 1, wherein first conductor structure comprises polysilicon.

4. The circuit device of claim 1, wherein the first and second conductor structures comprise a refractory metal silicide coating film.

5. The circuit device of claim 1, wherein the first and second members overlap in a plane such that a line in the plane and parallel to a longitudinal axis of the insulating structure passes through one or both of the first and second members.

6. The circuit device of claim 1, comprising a first interconnect structure coupled to the first conductor structure and a second interconnect structure coupled to the second conductor structure.

7. The circuit device of claim 1, comprising a voltage source and a current sensor coupled to the first and second conductor structures.

8. The circuit device of claim 1, wherein the circuit device is positioned on an integrated circuit.

9. The circuit device of claim 8, comprising a scribe line, the circuit device being positioned in the scribe line.

10. A circuit device, comprising:
an isolation structure positioned on a substrate;
a first conductor structure having a first member positioned on the isolation structure;
a second conductor structure having a second member positioned on the isolation structure, the second member projecting toward the first conductor structure and the first member projecting toward the second conductor structure, the first and second conductor structures not being in physical contact; and
whereby a current flowing between the first and second conductor structures when a bias is applied between the first and second conductor structures being indicative of a third conductor structure present on the isolation structure and contacting the first and second members.

11. The circuit device of claim 10, wherein the isolation structure comprises a trench isolation structure.

12. The circuit device of claim 11, wherein the trench isolation structure comprises TEOS.

13. The circuit device of claim 10, wherein first conductor structure comprises polysilicon.

14. The circuit device of claim 10, wherein the first and second conductor structures comprise a refractory metal silicide coating film.

15. The circuit device of claim 10, wherein the first and second members overlap in a plane such that a line in the plane and parallel to a longitudinal axis of the isolation structure passes through one or both of the first and second members.

16. The circuit device of claim 10, comprising a first interconnect structure coupled to the first conductor structure and a second interconnect structure coupled to the second conductor structure.

17. The circuit device of claim 10, comprising a voltage source and a current sensor coupled to the first and second conductor structures.

18. The circuit device of claim 10, wherein the circuit device is positioned on an integrated circuit.

19. The circuit device of claim 18, comprising a scribe line, the circuit device being positioned in the scribe line.

20. A circuit device, comprising:
    an isolation structure positioned on a substrate;
    a first conductor structure having a first plurality of members positioned in spaced-apart relation on the isolation structure to define a first plurality of gaps;
    a second conductor structure having a second plurality of members positioned in spaced-apart relation on the isolation structure, the second plurality of members projecting toward the first conductor structure and into one or more of the plurality of gaps, the first and second conductor structures not being in physical contact; and
    whereby a current flowing between the first and second conductor structures when a bias is applied between the first and second conductor structures being indicative of a third conductor structure present on the isolation structure and contacting at one of the first plurality of members and at least one of the second plurality of members.

21. The circuit device of claim 20, wherein the isolation structure comprises a trench isolation structure.

22. The circuit device of claim 21, wherein the trench isolation structure comprises TEOS.

23. The circuit device of claim 20, wherein first conductor structure comprises polysilicon.

24. The circuit device of claim 20, wherein the first and second conductor structures comprise a refractory metal silicide coating film.

25. The circuit device of claim 20, wherein the first and second members overlap in a plane such that a line in the plane and parallel to a longitudinal axis of the isolation structure passes through one or more of the first and second plurality of members.

26. The circuit device of claim 20, comprising a first interconnect structure coupled to the first conductor structure and a second interconnect structure coupled to the second conductor structure.

27. The circuit device of claim 20, comprising a voltage source and a current sensor coupled to the first and second conductor structures.

28. The circuit device of claim 20, wherein the circuit device is positioned on an integrated circuit.

29. The circuit device of claim 28, comprising a scribe line, the circuit device being positioned in the scribe line.

30. An integrated circuit, comprising:
    a substrate;
    a plurality of transistors on the substrate;
    an isolation structure positioned on the substrate;
    a first conductor structure having a first member positioned on the isolation structure;
    a second conductor structure having a second member positioned on the isolation structure, the second member projecting toward the first conductor structure and the first member projecting toward the second conductor structure, the first and second conductor structures not being in physical contact; and
    whereby a current flowing between the first and second conductor structures when a bias is applied between the first and second conductor structures being indicative of a third conductor structure present on the isolation structure and contacting the first and second members.

31. The integrated circuit of claim 30, wherein the isolation structure comprises a trench isolation structure.

32. The integrated circuit of claim 31, wherein the trench isolation structure comprises TEOS.

33. The integrated circuit of claim 30, wherein first conductor structure comprises polysilicon.

34. The integrated circuit of claim 30, wherein the first and second conductor structures comprise a refractory metal silicide coating film.

35. The integrated circuit of claim 30, wherein the first and second members overlap in a plane such that a line in the plane and parallel to a longitudinal axis of the isolation structure passes through one or both of the first and second members.

36. The integrated circuit of claim 30, comprising a first interconnect structure coupled to the first conductor structure and a second interconnect structure coupled to the second conductor structure.

37. The integrated circuit of claim 30, comprising a voltage source and a current sensor coupled to the first and second conductor structures.

38. The integrated circuit of claim 37, wherein the voltage source and the current sensor are positioned on the substrate.

39. The integrated circuit of claim 30, comprising a scribe line, the isolation structure and the first and second conductor structures being positioned in the scribe line.

40. The circuit device of claim 1, comprising a fourth conductor structure having a third member positioned on the other of the first or second portions of the insulating structure and projecting toward the second conductor structure.

41. The circuit device of claim 10, wherein the isolation structure comprises a first portion with a first width and a second portion with a second width greater than the first width, the first member being positioned on one of the first or second portions, the second member being positioned on the one of the first or second portions.

42. The circuit device of claim 20, wherein the isolation structure comprises a first portion with a first width and a second portion with a second width greater than the first width, the first plurality of members being positioned on one of the first or second portions, the second plurality of members being positioned on the one of the first or second portions.

43. The circuit device of claim 30, wherein the isolation structure comprises a first portion with a first width and a second portion with a second width greater than the first width, the first member being positioned on one of the first or second portions, the second member being positioned on the one of the first or second portions.

* * * * *